US012690679B2

(12) United States Patent
Chen et al.

(10) Patent No.: US 12,690,679 B2
(45) Date of Patent: Jul. 28, 2026

(54) BRACKET ASSEMBLY

(71) Applicants: King Slide Works Co., Ltd., Kaohsiung City (TW); King Slide Technology Co., Ltd., Kaohsiung City (TW)

(72) Inventors: Ken-Ching Chen, Kaohsiung City (TW); Shun-Ho Yang, Kaohsiung City (TW); Yao-Tsung Chen, Kaohsiung City (TW); Chun-Chiang Wang, Kaohsiung City (TW)

(73) Assignees: King Slide Works Co., Ltd., Kaohsiung City (TW); King Slide Technology Co., Ltd., Kaohsiung City (TW)

( * ) Notice: Subject to any disclaimer, the term of this patent is extended or adjusted under 35 U.S.C. 154(b) by 0 days.

(21) Appl. No.: 19/049,507

(22) Filed: Feb. 10, 2025

(65) Prior Publication Data

US 2026/0137210 A1      May 21, 2026

(30) Foreign Application Priority Data

Nov. 19, 2024    (TW) ................................. 113144683
Nov. 29, 2024    (TW) ................................. 113146588

(51) Int. Cl.
*A47B 96/06*          (2006.01)
*H05K 7/14*          (2006.01)
(52) U.S. Cl.
CPC ........... *A47B 96/06* (2013.01); *H05K 7/1489* (2013.01)

(58) Field of Classification Search
CPC ..... A47B 88/447; A47B 88/43; A47B 88/473; A47B 88/493; A47B 2210/0013; A47B 2210/0048; A47B 2210/0075; A47B 2210/0078; A47B 96/06; A47B 96/07; H05K 7/1489; H05K 7/1487; H05K 7/183
See application file for complete search history.

(56) References Cited

U.S. PATENT DOCUMENTS

| 1,902,795 | A | * | 3/1933 | Wolters | ................ | A47B 88/493 |
| | | | | | | 312/331 |
| 4,351,575 | A | * | 9/1982 | Rock | .................... | A47B 88/493 |
| | | | | | | 312/334.12 |
| 5,492,400 | A | * | 2/1996 | Rock | .................... | A47B 88/447 |
| | | | | | | 312/334.6 |

(Continued)

FOREIGN PATENT DOCUMENTS

| CN | | 201440774 U | 4/2010 | |
| DE | 102012100202 A1 | * | 7/2013 | ........... A47B 88/473 |

(Continued)

*Primary Examiner* — Patrick D Hawn
(74) *Attorney, Agent, or Firm* — Best & Flanagan LLP

(57) ABSTRACT

A bracket assembly includes a first bracket, a second bracket and a supporting member. The first bracket is arranged with a first mounting member. The second bracket is movable relative to the first bracket, and is arranged with a second mounting member. The supporting member is arranged on one side of the second bracket and configured to support a carried object. The supporting member includes a mounting feature and configured to mount a portion of the carried object. The first bracket includes a reinforcement structure located adjacent to the mounting feature.

16 Claims, 14 Drawing Sheets

(56) References Cited

U.S. PATENT DOCUMENTS

| | | | | | |
|---|---|---|---|---|---|
| 6,021,909 | A * | 2/2000 | Tang | H05K 7/1421 | |
| | | | | 211/183 | |
| 6,513,770 | B1 * | 2/2003 | Franz | H05K 7/1489 | |
| | | | | 312/223.1 | |
| 6,666,306 | B2 * | 12/2003 | Gasser | F16F 7/08 | |
| | | | | 188/82.1 | |
| 6,860,575 | B2 * | 3/2005 | Chen | A47B 88/493 | |
| | | | | 312/334.44 | |
| 7,762,411 | B2 * | 7/2010 | Hilburn | A47B 88/43 | |
| | | | | 211/192 | |
| 8,210,623 | B2 * | 7/2012 | Chen | A47B 88/49 | |
| | | | | 312/331 | |
| 8,335,080 | B2 * | 12/2012 | Huang | H05K 7/183 | |
| | | | | 312/333 | |
| 8,371,454 | B2 * | 2/2013 | Chen | H05K 7/1421 | |
| | | | | 312/334.4 | |
| 8,562,086 | B1 * | 10/2013 | Baik | A47B 88/931 | |
| | | | | 312/334.4 | |
| 8,950,593 | B2 * | 2/2015 | Chen | H05K 7/1489 | |
| | | | | 312/334.1 | |
| 8,960,820 | B2 * | 2/2015 | Chen | A47B 88/45 | |
| | | | | 312/331 | |
| 9,044,088 | B2 * | 6/2015 | Greussing | A47B 88/493 | |
| 9,161,625 | B2 | 10/2015 | Chen et al. | | |
| 9,363,920 | B1 * | 6/2016 | Li | H05K 7/1489 | |
| 9,526,334 | B2 * | 12/2016 | Liang | A47B 88/487 | |
| 10,080,435 | B2 * | 9/2018 | Janzen | E05F 5/08 | |
| 10,136,548 | B2 * | 11/2018 | Chen | F16C 29/02 | |
| 10,349,550 | B2 * | 7/2019 | Liu | H05K 7/1489 | |
| 10,376,055 | B2 * | 8/2019 | Chen | H05K 7/183 | |
| 10,485,344 | B2 * | 11/2019 | Chen | H05K 7/183 | |
| 10,646,040 | B2 * | 5/2020 | Chen | A47B 47/0058 | |
| 10,743,661 | B1 | 8/2020 | Wu et al. | | |
| 10,925,398 | B2 * | 2/2021 | Chen | A47B 88/43 | |
| 11,019,926 | B2 * | 6/2021 | Mattern | B65G 21/22 | |
| 11,060,557 | B2 * | 7/2021 | Chen | A47B 88/473 | |
| 11,202,504 | B2 * | 12/2021 | Kim | A47B 88/493 | |
| 11,272,784 | B2 * | 3/2022 | Meusburger | A47B 88/493 | |
| 11,375,811 | B2 | 7/2022 | Chen et al. | | |
| 12,055,169 | B2 * | 8/2024 | Chen | F16B 12/10 | |
| 12,289,857 | B1 * | 4/2025 | Chen | H05K 7/1489 | |
| 12,310,497 | B2 * | 5/2025 | Chen | A47B 88/483 | |
| 12,513,848 | B2 * | 12/2025 | Tseng | A47B 88/40 | |
| 2011/0180316 | A1 * | 7/2011 | Nakayama | H05K 7/1421 | |
| | | | | 312/223.1 | |
| 2015/0129526 | A1 | 5/2015 | Chen et al. | | |
| 2015/0181753 | A1 * | 6/2015 | Murakami | H05K 7/1489 | |
| | | | | 211/162 | |
| 2016/0324318 | A1 * | 11/2016 | Langguth | F16C 29/005 | |
| 2017/0184151 | A1 * | 6/2017 | Huang | A47B 88/45 | |
| 2020/0077794 | A1 * | 3/2020 | Zimmermann | B60N 2/773 | |
| 2025/0386934 | A1 * | 12/2025 | Prentner | A47B 88/493 | |

FOREIGN PATENT DOCUMENTS

| | | | | | |
|---|---|---|---|---|---|
| DE | 202014006378 U1 * | 11/2015 | | A47B 88/49 | |
| EP | 3157313 B1 | 4/2018 | | | |
| EP | 3449766 B1 | 8/2019 | | | |
| KR | 20190041394 A * | 4/2019 | | A47B 88/437 | |
| WO | WO-2018133431 A1 * | 7/2018 | | A47B 88/447 | |

* cited by examiner

BRACKET ASSEMBLY

BACKGROUND OF THE INVENTION

1. Field of the Invention

The present invention relates to a bracket, and more particularly, to a bracket assembly configured to mount a carried object.

2. Description of the Prior Art

China patent publication number CN 201440774U discloses a slide rail mechanism applicable to a computer case. The computer case is configured to be slidably mounted into a rack along a sliding direction through a slide rail structure. One side wall of the computer case has a positioning groove (U-shaped groove). On the other hand, the slide rail structure comprises a fixing elastic piece having a limiting part. During a process of the computer case being slidably mounted into the rack along the sliding direction, a necking section of the limiting part is configured to abut against the positioning groove, such that the computer case is blocked to be no longer further moved along the sliding direction. In other words, through interaction between the necking section of the limiting part and the positioning groove, a moving range of the computer case can be limited, such that the computer case cannot be further pushed into the rack.

U.S. Pat. No. 9,161,625 B2 discloses a slide rail assembly configured to be mounted to a rack for carrying a carried object (such as a chassis). When the carried object is pushed into the rack from outside, one end part of the carried object is configured to abut against a stop portion of a support member, so as to stop the carried object at a position.

The aforementioned patents teach stopping the carried object (the computer case or chassis) at a position. However, for different market requirements, it is important to develop various products.

SUMMARY OF THE INVENTION

The present invention relates to a bracket assembly configured to mount a carried object.

According to an embodiment of the present invention, a bracket assembly comprises a first bracket, a second bracket and a supporting member. The first bracket is arranged with a first mounting member. The second bracket is longitudinally movable relative to the first bracket. The second bracket is arranged with a second mounting member. The supporting member is arranged on the second bracket and configured to support a carried object. The supporting member is arranged with a mounting feature configured to mount the carried object. The first bracket comprises a reinforcement structure adjacent to the mounting feature.

According to another embodiment of the present invention, a bracket assembly is applicable to a rack having a first post and a second post. The bracket assembly comprises a first bracket, a second bracket and a supporting member. The first bracket is arranged with a first mounting member. The second bracket is longitudinally movable relative to the first bracket. The second bracket is arranged with a second mounting member. The first mounting member and the second mounting member are configured to be mounted to the first post and the second post respectively. The supporting member is arranged on the second bracket and configured to support a carried object. The supporting member is arranged with a mounting feature configured to allow a portion of the carried object to insert therein when the carried object is retracted relative to the rack from a first predetermined position to a second predetermined position.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
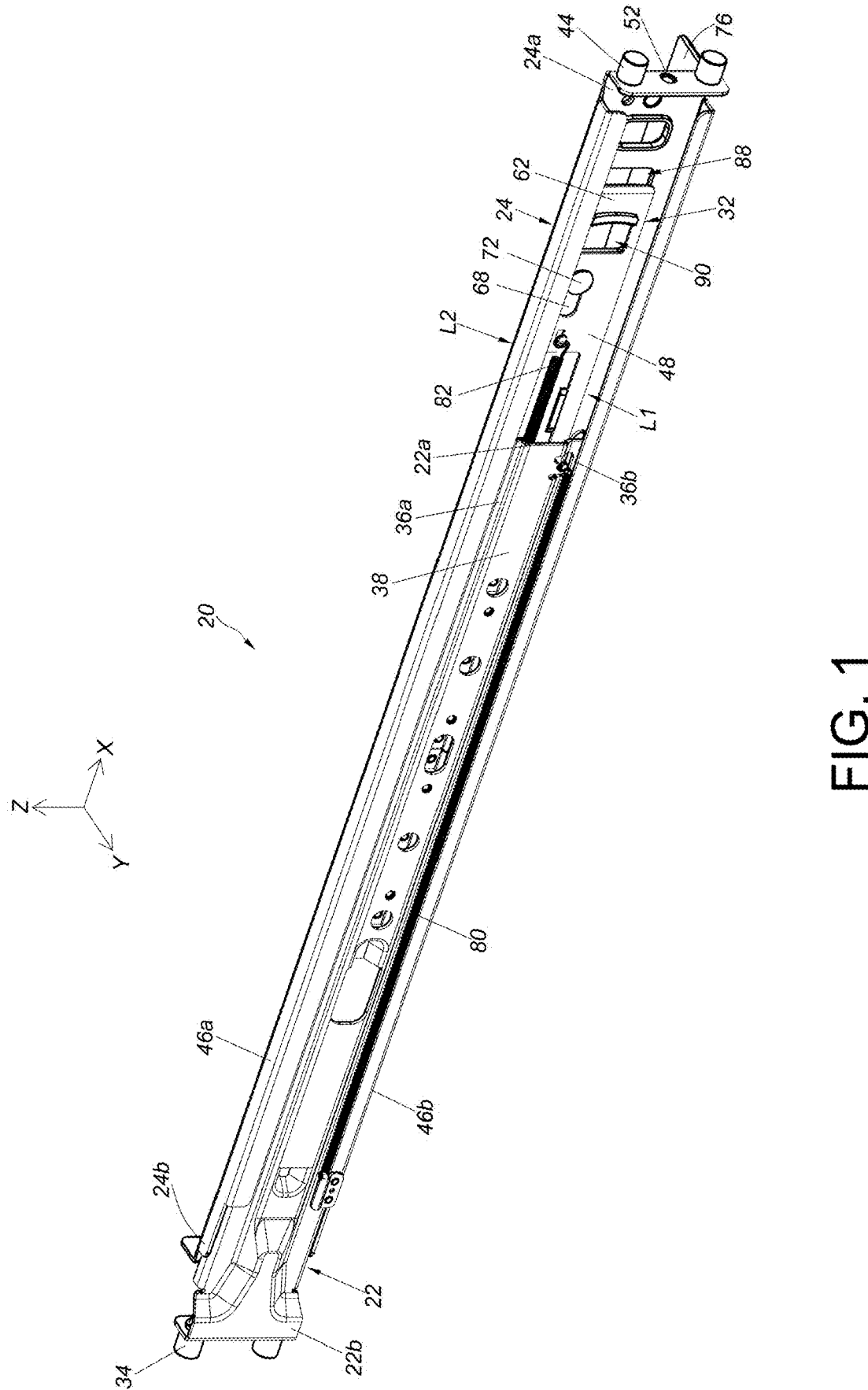
FIG. 1 is a diagram showing a bracket assembly according to a first embodiment of the present invention.
Figure 2:
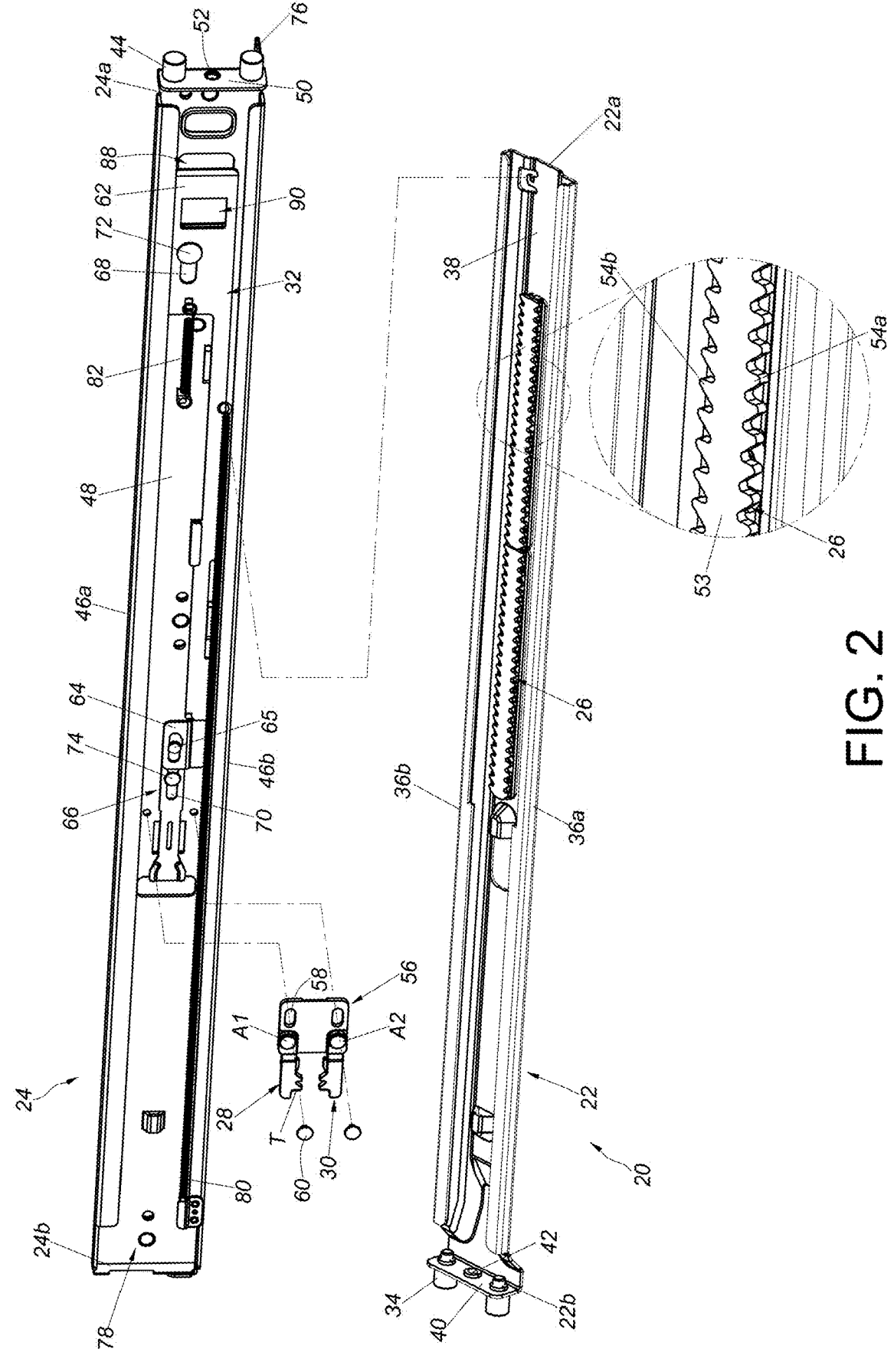
FIG. 2 is an exploded view of the bracket assembly according to the first embodiment of the present invention.

As shown in FIG. 1 and FIG. 2, a bracket assembly 20 comprises a first bracket 22, a second bracket 24, a toothed bar 26, at least one working member (such as a first working member 28 and a second working member 30, but one working member is enough to function) and an operating member 32 according to a first embodiment of the present invention.

The first bracket 22 has a first end 22*a* and a second end 22*b* opposite to each other, such as a front end and a rear end, but the present invention is not limited thereto. The first bracket 22 is arranged with at least one first mounting member 34. The first bracket 22 comprises a first wall 36*a*, a second wall 36*b*, and a longitudinal wall 38 connected between the first wall 36*a* and the second wall 36*b* of the first bracket 22. Preferably, the first mounting member 34 is located adjacent to the second end 22*b* of the first bracket 22. In the present embodiment, the second end 22*b* of the first bracket 22 is arranged with an end plate 40, and the first mounting member 34 is arranged on the end plate 40. In addition, the end plate 40 of the first bracket 22 is formed with a connecting hole 42.

The second bracket 24 is longitudinally movable relative to the first bracket 22. In the present embodiment, the X axis is a longitudinal direction (or a length direction of the bracket), the Y axis is a transverse direction (or a lateral direction of the bracket), and the Z axis is a vertical direction (or a height direction of the bracket). The second bracket 24 has a first end 24*a* and a second end 24*b* opposite to each other, such as a front end and a rear end, but the present invention is not limited thereto. The second bracket 24 is arranged with at least one second mounting member 44. The second bracket 24 comprises a first wall 46*a*, a second wall 46*b*, and a longitudinal wall 48 connected between the first wall 46*a* and the second wall 46*b* of the second bracket 24. Preferably, the second mounting member 44 is located adjacent to the first end 24*a* of the second bracket 24. In the present embodiment, the first end 24*a* of the second bracket 24 is arranged with an end plate 50, and the second mounting member 44 is arranged on the end plate 50. In addition, the end plate 50 of the second bracket 24 is formed with a connecting hole 52.

The toothed bar 26 is arranged on the first bracket 22. More specifically, the toothed bar 26 is connected (such as fixedly connected) to the longitudinal wall 38 of the first bracket 22. The toothed bar 26 has a predetermined longitudinal length that is smaller than a length of the first bracket 22. The toothed bar 26 has a plurality of tooth parts spaced apart from each other, and the plurality of tooth parts have substantially identical structural configuration. In the present embodiment, two sides of a main body 53 of the toothed bar 26 are arranged with a plurality of first tooth parts 54*a* and a plurality of second tooth parts 54*b* respectively, but the present invention is not limited thereto. In the present invention, it is enough to function by arranging the tooth parts at one side of the main body 53 of the toothed bar 26. Preferably, the toothed bar 26 is a one-way toothed bar. For example, both a row of the first tooth parts 54*a* and a row of the second tooth parts 54*b* can work as a one-way toothed bar.

Figure 3:
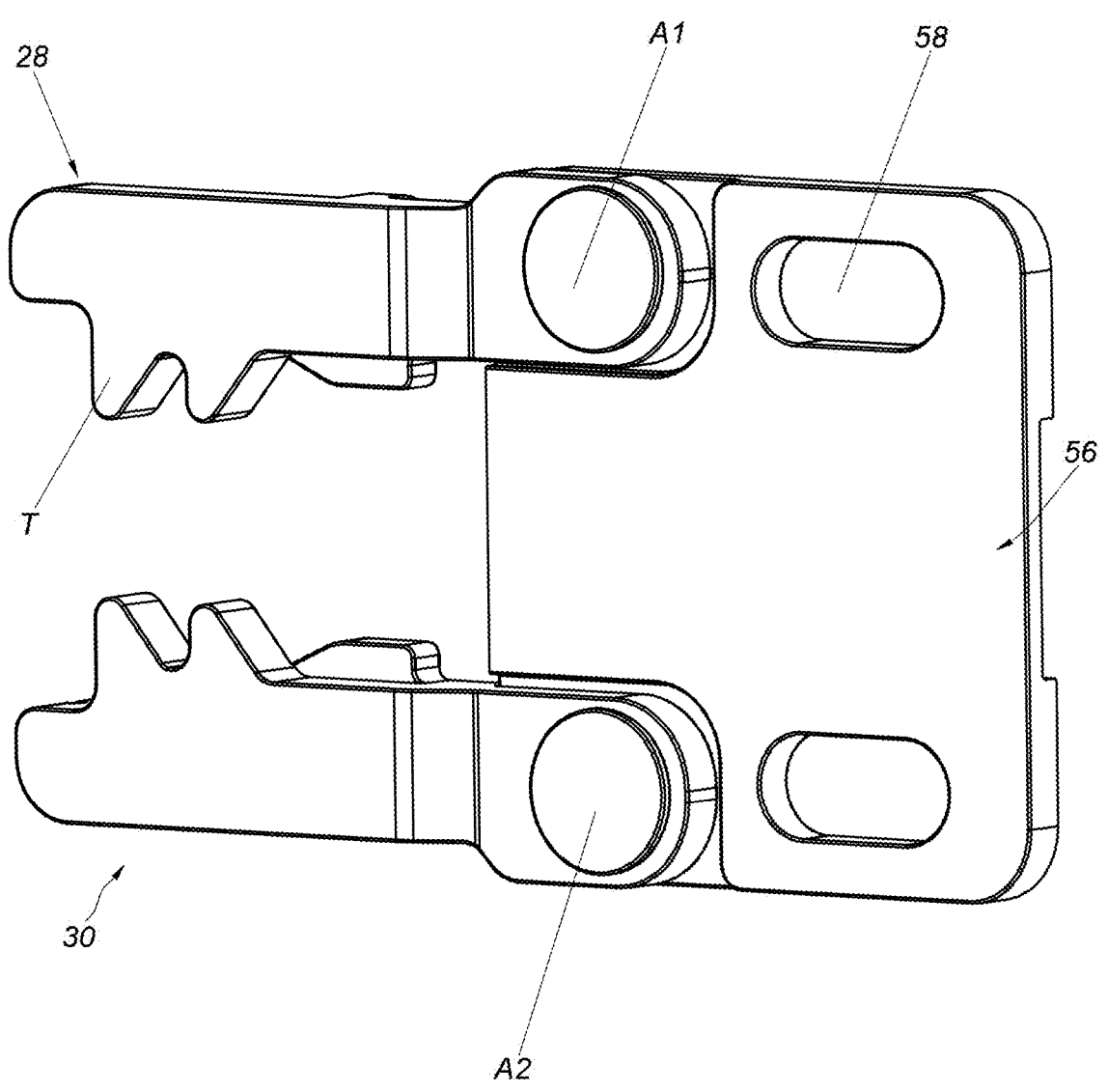
FIG. 3 is a diagram showing an auxiliary member and a working member of the bracket assembly according to the first embodiment of the present invention.

As shown in FIG. 2 and FIG. 3, the first working member 28 and the second working member 30 are arranged on the second bracket 24, and the first working member 28 and the second working member 30 are configured to be respectively engaged with the first tooth parts 54*a* and the second tooth parts 54*b* of the toothed bar 26. The first working member 28 and the second working member 30 have substantially identical structural configuration. For example, each of the first working member 28 and the second working member 30 is a backstop pawl. In addition, interaction between the first working member 28 and the toothed bar 26 is substantially identical to interaction between the second working member 30 and the toothed bar 26. Therefore, when features of the first working member 28 are described below, the second working member 30 also has substantially the same features.

Specifically, the first working member 28 can be engaged (or meshed) with the first tooth part 54*a* of the toothed bar 26 through at least one tooth section T. Or, the tooth section T of the first working member 28 can be disengaged from the first tooth part 54*a* of the toothed bar 26 (or the tooth section T of the first working member 28 is no longer meshed with the first tooth part 54*a* of the toothed bar 26). Preferably, the bracket assembly 20 further comprises an auxiliary member 56 configured to be mounted to the second bracket 24, and the first working member 28 and the second working member 30 are pivotally connected to the auxiliary member 56 on the second bracket 24 through a first shaft member A1 and a second shaft member A2 respectively. Preferably, the auxiliary member 56 is movably mounted to the longitudinal wall 48 of the second bracket 24. For example, one of the auxiliary member 56 and the second bracket 24 is formed with at least one longitudinal hole 58, and the other one of the auxiliary member 56 and the second bracket 24 is arranged with a connecting member 60 configured to pass through a portion of the longitudinal hole 58. In the present embodiment, the auxiliary member 56 is formed with the longitudinal hole 58, the second bracket 24 is arranged with the connecting member 60 configured to pass through a portion of the longitudinal hole 58, and the connecting member 60 is configured to be connected (such as fixedly connected) to the longitudinal wall 48 of the second bracket 24. Accordingly, the auxiliary member 56 is longitudinally movable relative to the second bracket 24 within a limited range.

As shown in FIG. 2, the operating member 32 is movably mounted on the second bracket 24. The operating member 32 is configured to drive the first working member 28 (and the second working member 30) to move. The operating member 32 comprises an operating part 62 and an extending part 64 longitudinally extended a predetermined distance from the operating part 62. The extending part 64 is configured to interact with the first working member 28 (and the second working member 30). In the present embodiment, the extending part 64 is connected (such as fixedly connected) to a driving member 66 through a fixing member 65, such that the driving member 66 and the operating member 32 can be seemed as one piece. The extending part 64 is configured to interact with the first working member 28 (and the second working member 30) through the driving member 66. Preferably, the operating member 32 and the driving member 66 have a first elongated hole 68 and a second elongated hole 70 respectively, and a first connecting feature 72 and a second connecting feature 74 are configured to respectively pass through a portion of the first elongated hole 68 and a portion of the second elongated hole 70, so as to mount the operating member 32 and the driving member 66 to the longitudinal wall 48 of the second bracket 24.

Preferably, the second bracket 24 has a first side L1 and a second side L2 opposite to each other, such as an outer side and an inner side. The first side L1 of the second bracket 24 faces toward the first bracket 22, and the second side L2 of the second bracket 24 is arranged with a supporting member 76 (please refer to FIG. 1).

Preferably, one of the first bracket 22 and the second bracket 24 is formed with a predetermined passage 78 configured to movably mount the other one of the first bracket 22 and the second bracket 24. For example, the second bracket 24 is formed with the predetermined passage 78, and the first end 22a of the first bracket 22 is configured to be inserted into the predetermined passage 78 of the second bracket 24 through a passage opening of the predetermined passage 78 at the second end 24b of the second bracket 24, such that the first bracket 22 and the second bracket 24 are longitudinally movable relative to each other.

Preferably, the bracket assembly 20 further comprises an elastic member 80 configured to provide an elastic force to the first bracket 22 and the second bracket 24. Furthermore, the elastic member 80 is mounted between the first bracket 22 and the second bracket 24.

Preferably, the bracket assembly 20 further comprises a return elastic member 82 configured to provide a return elastic force to the operating member 32.

Figure 4:
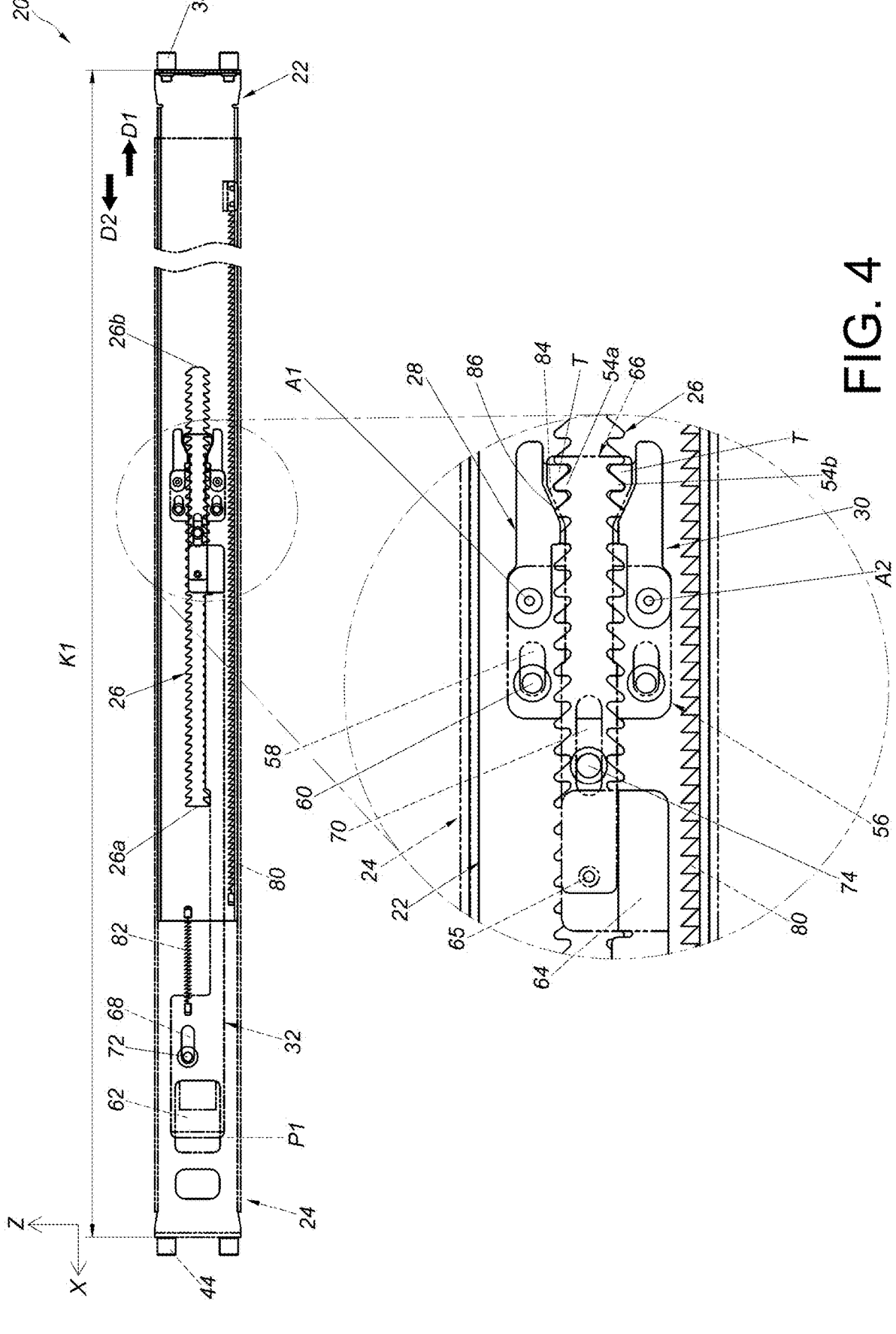
FIG. 4 is a diagram showing the bracket assembly having a first length according to the first embodiment of the present invention.
Figure 5:
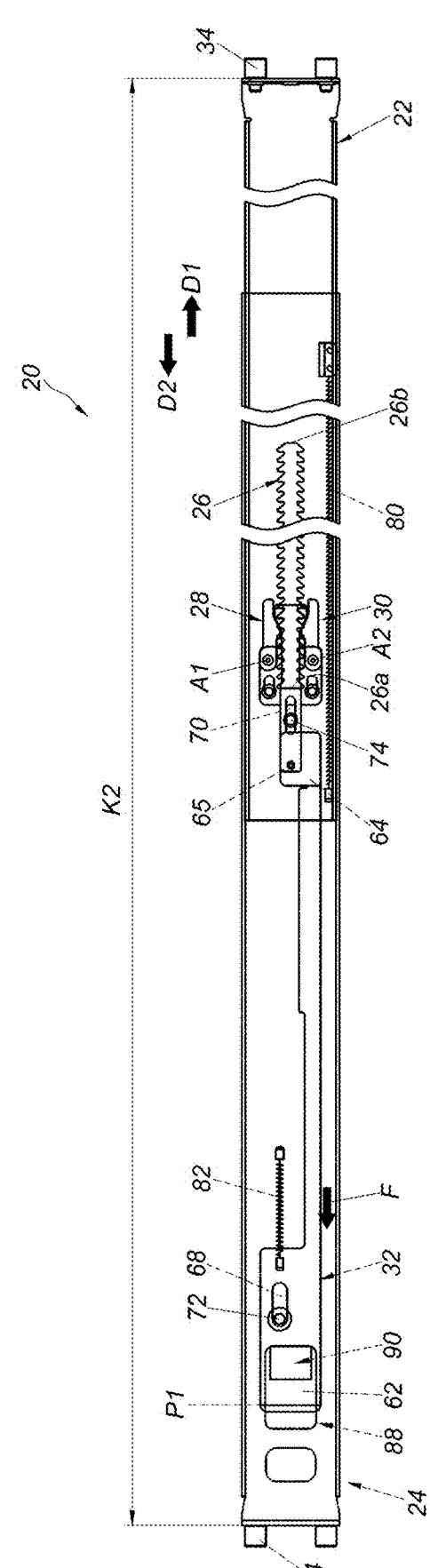
FIG. 5 is a diagram showing the bracket assembly having a second length according to the first embodiment of the present invention.
Figure 5:
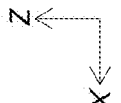

As shown in FIG. 4 and FIG. 5, a length of the bracket assembly 20 is adjustable. The toothed bar 26 has a first end 26a and a second end 26b opposite to each other, such as a front end and a rear end, but the present invention is not limited thereto. Specifically, when the tooth section T of the first working member 28 is engaged with the first tooth part 54a of the toothed bar 26 (or when the tooth section T of the second working member 30 is engaged with the second tooth part 54b of the toothed bar 26), the first bracket 22 is only movable relative to the second bracket 24 along a first direction D1, and the second bracket 24 is only movable relative to the first bracket 22 along a second direction D2 opposite to the first direction D1, such that a distance defined between the first mounting member 34 and the second mounting member 44 is adjustable from a first length K1 (as shown in FIG. 4) to a second length K2 (as shown in FIG. 5), and the second length K2 is greater than the first length K1. When the first working member 28 (and the second working member 30) is engaged with the toothed bar 26, the first bracket 22 is not movable relative to the second bracket 24 along the second direction D2, and the second bracket 24 is not movable relative to the first bracket 22 along the first direction D1.

Preferably, when the bracket assembly 20 has the first length K1, the first working member 28 (and the second working member 30) is located adjacent to the second end 26b of the toothed bar 26. When the bracket assembly 20 has the second length K2, the first working member 28 (and the second working member 30) is located adjacent to the first end 26a of the toothed bar 26.

Preferably, one of the driving member 66 on the operating member 32 and the first working member 28 has a guiding feature. The guiding feature has an inclined surface or an arc surface. In the present embodiment, the driving member 66 on the operating member 32 has a first guiding feature 84, and the first working member 28 has a second guiding feature 86. When the operating member 32 is located at a first operating position P1, the first guiding feature 84 and the second guiding feature 86 face each other and are adjacent to each other (as shown in FIG. 4). On the other hand, arrangement of guiding features between the driving member 66 on the operating member 32 and the second working member 30 is similar to the arrangement of guiding features between the driving member 66 on the operating member 32 and the first working member 28. Therefore, no further illustration is provided.

Figure 6:
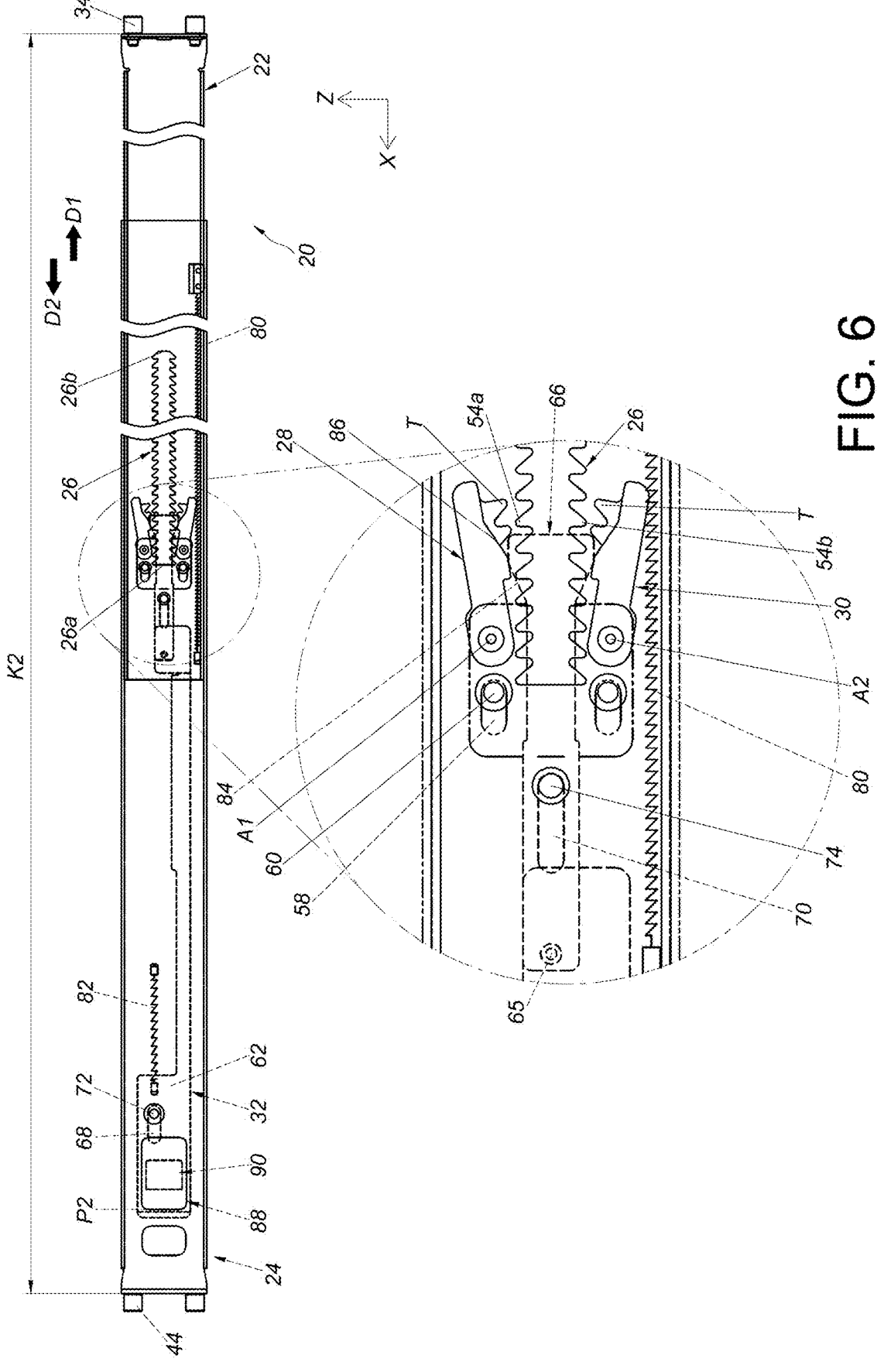
FIG. 6 is a diagram showing the bracket assembly having the second length according to the first embodiment of the present invention.

As shown in FIG. 5 and FIG. 6, when the bracket assembly 20 has the second length K2 and when a user is going to shorten the bracket assembly 20, the user can apply a predetermined force F (such as a pulling force) to the operating part 62 of the operating member 32, such that the operating member 32 is moved from the first operating position P1 to a second operating position P2 in order to drive the first working member 28 and the second working member 30 to disengage from the toothed bar 26 (as shown in FIG. 6, the first working member 28 and the second working member 30 are no longer engaged with the toothed bar 26). Therefore, the first bracket 22 and the second bracket 24 are movable relative to each other along the first direction D1 and the second direction D2. For example, the first bracket 22 is movable relative to the second bracket 24 along the first direction D1 and the second direction D2, and the second bracket 24 is movable relative to the first bracket 22 along the first direction D1 and the second direction D2. When the first bracket 22 is moved relative to the second bracket 24 along the second direction D2, or when the second bracket 24 is moved relative to the first bracket 22 along the first direction D1, the length of the bracket assembly 20 is adjusted to be shortened from the second length K2 to the first length K1, or to be shortened to any length between the first length K1 and the second length K2.

Preferably, during a process of the operating member 32 being moved from the first operating position P1 to the second operating position P2, the operating member 32 is configured to drive the first working member 28 to rotate through mutual contact between the first guiding feature 84 and the second guiding feature 86, so as to disengage the tooth section T of the first working member 28 from the first tooth part 54a of the toothed bar 26. On the other hand, configuration of disengaging the tooth section T of the second working member 30 from the second tooth part 54b of the toothed bar 26 is identical to configuration of disengaging the tooth section T of the first working member 28 from the first tooth part 54a of the toothed bar 26. Therefore, no further illustration is provided.

Preferably, the longitudinal wall 48 of the second bracket 24 is formed with a predetermined hole 88 communicating the first side L1 and the second side L2 of the second bracket 24, and the predetermined hole 88 is located adjacent to or corresponding to a corresponding hole 90 of the operating part 62 of the operating member 32 (please also refer to FIG. 2), so as to allow a finger of the user to pass through predetermined hole 88 and the corresponding hole 90, such that the user can easily apply the predetermined force F to the operating part 62 of the operating member 32.

Preferably, when the operating member 32 is located at the second operating position P2, the return elastic member 82 is configured to accumulate a return elastic force. Once the user stops applying the predetermined force F, the operating member 32 is configured to return to the first operating position P1 from the second operating position P2 in response to the return elastic force.

Figure 7:
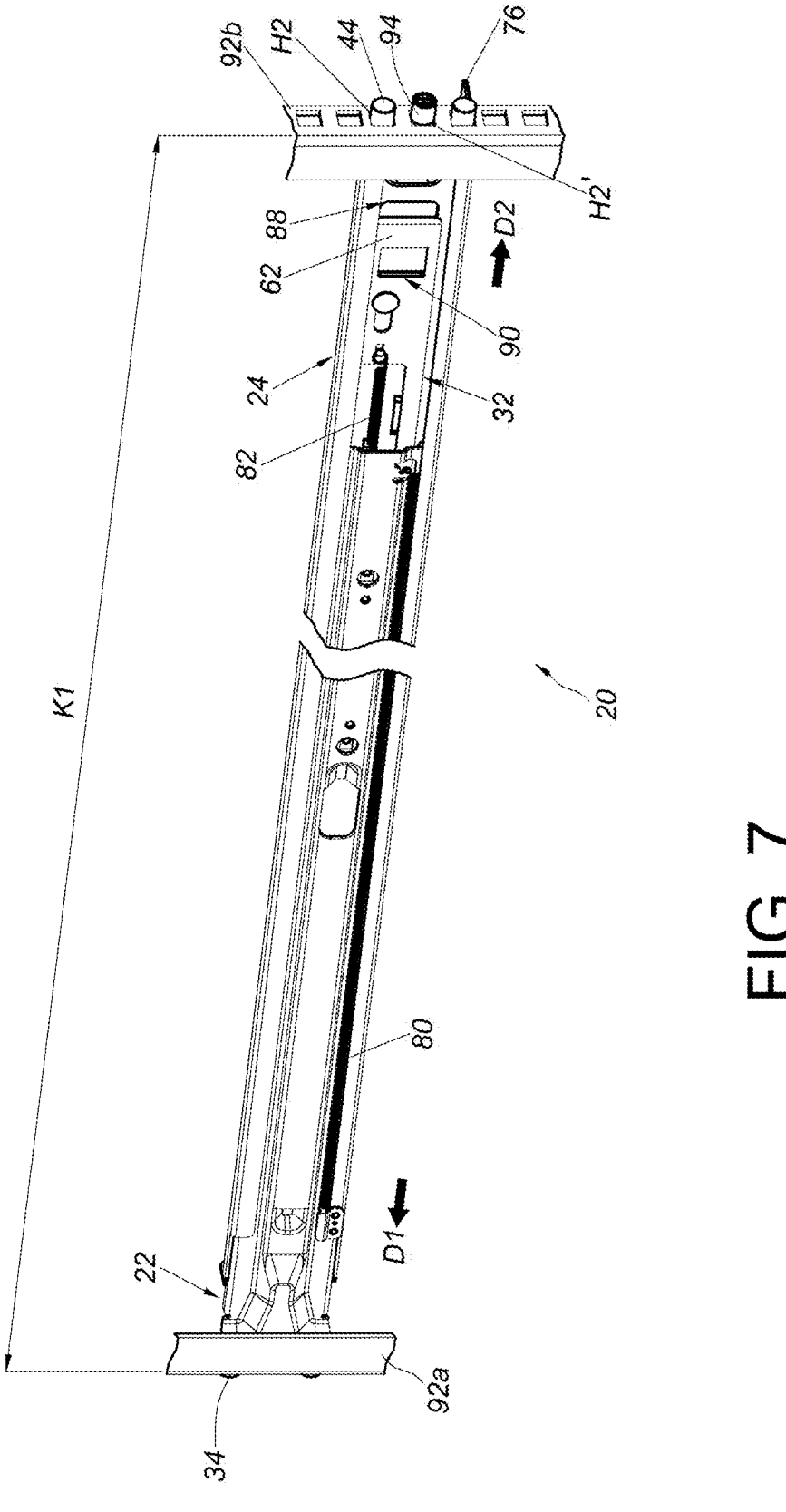
FIG. 7 is a diagram showing the bracket assembly having the first length and configured to be mounted to a rack having a first longitudinal depth according to the first embodiment of the present invention.

As shown in FIG. 7, the bracket assembly 20 is applicable to a rack which comprises a first post 92a and a second post 92b. In the present embodiment, a first longitudinal distance is defined between the first post 92a and the second post 92b (the rack has a first longitudinal depth). Moreover, when the length of the bracket assembly 20 is adjusted to the first length K1, the first mounting member 34 of the first bracket 22 is configured to be mounted to the first post 92a, and the second mounting member 34 of the second bracket 24 is configured to be mounted to the second post 92b.

Preferably, the first mounting member 34 of the first bracket 22 is configured to be moved along the first direction D1 in response to the elastic force of the elastic member 80 to be mounted to a first mounting hole H1 (please also refer to FIG. 9) of the first post 92a, or the second mounting member 44 of the second bracket 24 is configured to be moved along the second direction D2 in response to the elastic force of the elastic member 80 to be mounted to a second mounting hole H2 of the second post 92b. Therefore, reliability and safety of the bracket assembly 20 being mounted to the rack can be improved.

Preferably, the user can insert a connecting member (such as a screw) into a first fixing hole H1' of the first post 92a and screw it into the connecting hole 42 of the end plate 40 of the first bracket 22 (please also refer to FIG. 9) for fixing the first bracket 22 to the first post 92a. Moreover, the user can insert another connecting member 94 (such as a screw) into a second fixing hole H2' of the second post 92b and screw it into the connecting hole 52 of the end plate 50 of the second bracket 24 for fixing the second bracket 24 to the second post 92b.

Preferably, the supporting member 76 is configured to support a carried object (such as an electronic device or a chassis, not shown in figures).

Figure 8:
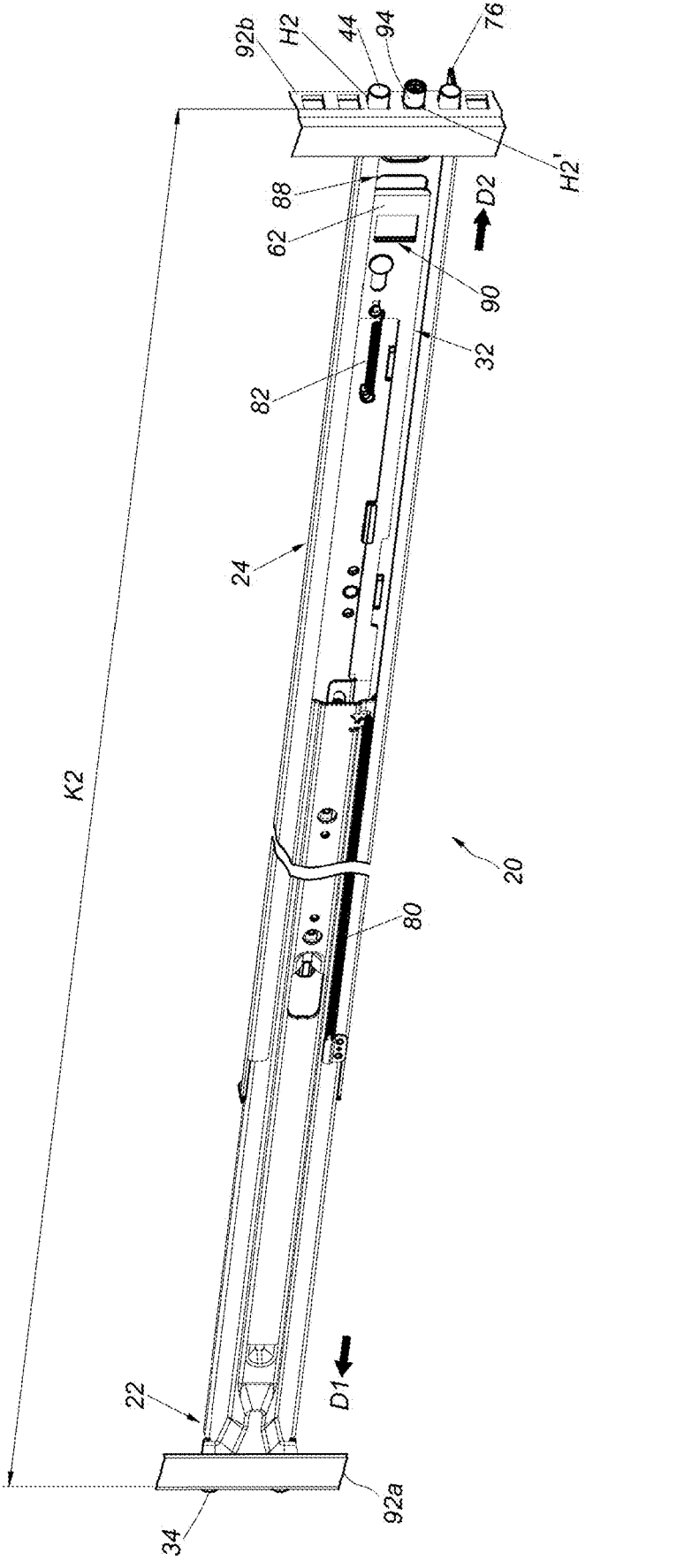
FIG. 8 is a diagram showing the bracket assembly having the second length and configured to be mounted to a rack having a second longitudinal depth according to the first embodiment of the present invention.

As shown in FIG. 8, the rack comprises a first post 92a and a second post 92b. In the present embodiment, a second longitudinal distance is defined between the first post 92a and the second post 92b (the rack has a second longitudinal depth), and the second longitudinal distance is greater than the first longitudinal distance. Furthermore, when the length of the bracket assembly 20 is adjusted to the second length K2, the first mounting member 34 of the first bracket 22 is configured to be mounted to the first post 92a, and the second mounting member 44 of the second bracket 24 is configured to be mounted to the second post 92b.

Preferably, the first mounting member 34 of the first bracket 22 is configured to be moved along the first direction D1 in response to the elastic force of the elastic member 80 to be mounted to the first mounting hole H1 (please also refer to FIG. 9) of the first post 92a, or the second mounting member 44 of the second bracket 24 is configured to be moved along the second direction D2 in response to the elastic force of the elastic member 80 to be mounted to the second mounting hole H2 of the second post 92b. Therefore, reliability and safety of the bracket assembly 20 being mounted to the rack can be improved.

Preferably, the user can insert a connecting member (such as a screw) into the first fixing hole H1' of the first post 92a and screw it into the connecting hole 42 of the end plate 40 of the first bracket 22 (please also refer to FIG. 9) for fixing the first bracket 22 to the first post 92a. Moreover, the user can insert another connecting member 94 (such as a screw) into the second fixing hole H2' of the second post 92b and screw it into the connecting hole 52 of the end plate 50 of the second bracket 24 for fixing the second bracket 24 to the second post 92b.

Therefore, the bracket assembly 20 can be adjusted to different lengths in order to be mounted to racks with different longitudinal depths, and the user can operate the operating member 32 to disengage the first working member 28 (and the second working member 30) from the toothed bar 26, such that the length of the bracket assembly 20 can be shortened in order to detach the bracket assembly 20 from the rack.

Figure 9:
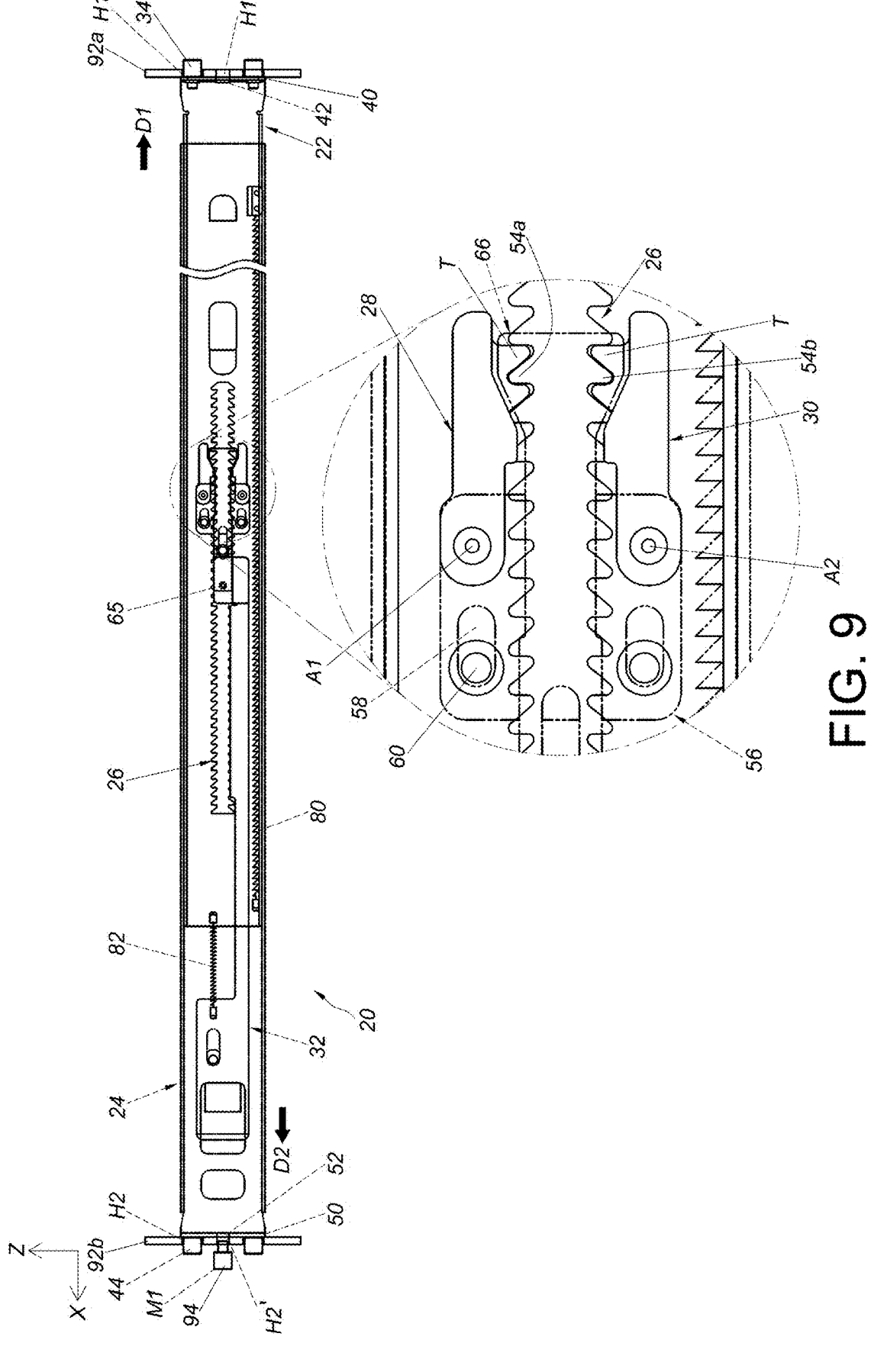
FIG. 9 is a diagram showing the bracket assembly being mounted to the rack with a connecting member being located at a first locking position according to the first embodiment of the present invention.
Figure 10:
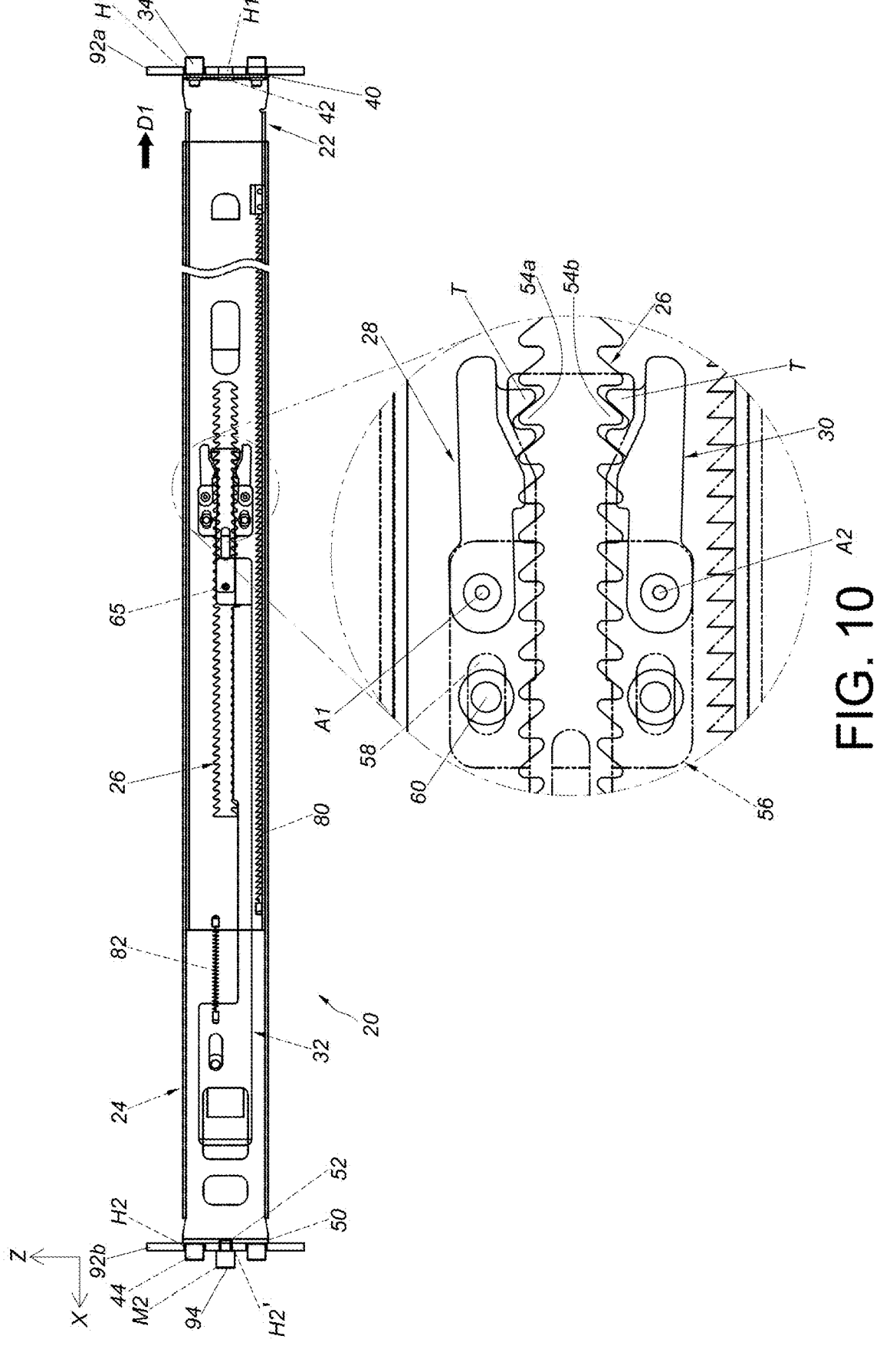
FIG. 10 is a diagram showing the bracket assembly being mounted to the rack with the connecting member being located at a second locking position according to the first embodiment of the present invention.

As shown in FIG. 9 and FIG. 10, the auxiliary member 56 and the second bracket 24 are longitudinally movable relative to each other, and the first working member 28 and the second working member 30 are movably mounted (such as pivotally connected) to the auxiliary member 56. Therefore, damage due to the tooth sections T of the first working member 28 and the second working member 30 being too tightly engaged (or meshed) with the tooth parts (the first tooth parts 54a and the second tooth parts 54b) of the toothed bar 26 can be prevented.

When the bracket assembly 20 is adjusted to a length corresponding to the longitudinal depth of the rack, the first mounting member 34 of the first bracket 22 can be mounted (inserted) into the first mounting hole H1 of the first post 92a, and the second mounting member 44 of the second bracket 24 can be mounted (inserted) into the second mounting hole H2 of the second post 92b. Thereafter, the bracket assembly 20 can be fastened to the rack by a connecting member (such as a screw), so as to improve stability and safety of the bracket assembly when being mounted to the rack.

However, a longitudinal gap may exist between the bracket assembly 20 and the rack due to component dimension tolerance during a process of mounting the bracket assembly 20 to the rack. For example, when the first mounting member 34 of the first bracket 22 and the second mounting member 44 of the second bracket 24 are respectively mounted (inserted) to the first post 92a and the second post 92b, a longitudinal gap may exist between the end plate 40 of the first bracket 22 and the first post 92a, or between the end plate 50 of the second bracket 24 and the second post 92b due to component dimension tolerance. Furthermore, during a process of the connecting member 94 (such as a screw) being inserted into the second fixing hole H2' of the second post 92b to be further fixed (and screwed) to the connecting hole 52 of the end plate 50 of the second bracket 24, a pulling force along the second direction D2 is generated when the connecting member 94 is moved from a first locking position M1 (as shown in FIG. 9) to a second locking position M2 (as shown in FIG. 10). Or, the user can insert the connecting member (such as a screw, not shown in figures) into the first fixing hole H1' of the first post 92a and fix (and screw) it to the connecting hole 42 of the end plate 40 of the first bracket 22. During such fixing and screwing process, the second bracket 24 is slightly longitudinally moved along the second direction D2 in response to the pulling force along the second direction D2, or the first bracket 22 is slightly longitudinally moved along the first direction D1 in response to another pulling force along the first direction D1. Accordingly, the first working member 28 and the second working member 30 engaged (or meshed) with the toothed bar 26 can be moved slightly relative to the toothed bar 26. In other words, through arranging the longitudinal hole 58 between the auxiliary member 56 and the second bracket 24, the auxiliary member 56 and the second bracket 24 are longitudinally movable relative to each other, so as to reduce effect of the longitudinal gap due to component dimension tolerance when the bracket assembly 20 is mounted to the rack, or to prevent damage due to the pulling force causing the tooth sections T of the first working member 28 and the second working member 30 being too tightly engaged (or meshed) with the tooth parts (the first tooth parts 54a and the second tooth parts 54b) of the toothed bar 26. Preferably, a maximum longitudinal movable distance of the auxiliary member 56 relative to the second bracket 24 is smaller than a distance between two adjacent first tooth parts 54a or two adjacent second tooth parts 54b.

Moreover, when the bracket assembly 20 is mounted to the rack, if the bracket assembly 20 is subjected to unexpected impact or the rack is subjected to impact during transportation, the auxiliary member 56 can be slightly moved to disperse the impact of such situations through arranging the longitudinal hole 58 between the auxiliary member 56 and the second bracket 24, so as to prevent the damage due to the tooth sections T of the first working member 28 and the second working member 30 being engaged with the tooth parts (the first tooth parts 54*a* and the second tooth parts 54*b*) of the toothed bar 26.

Figure 11:
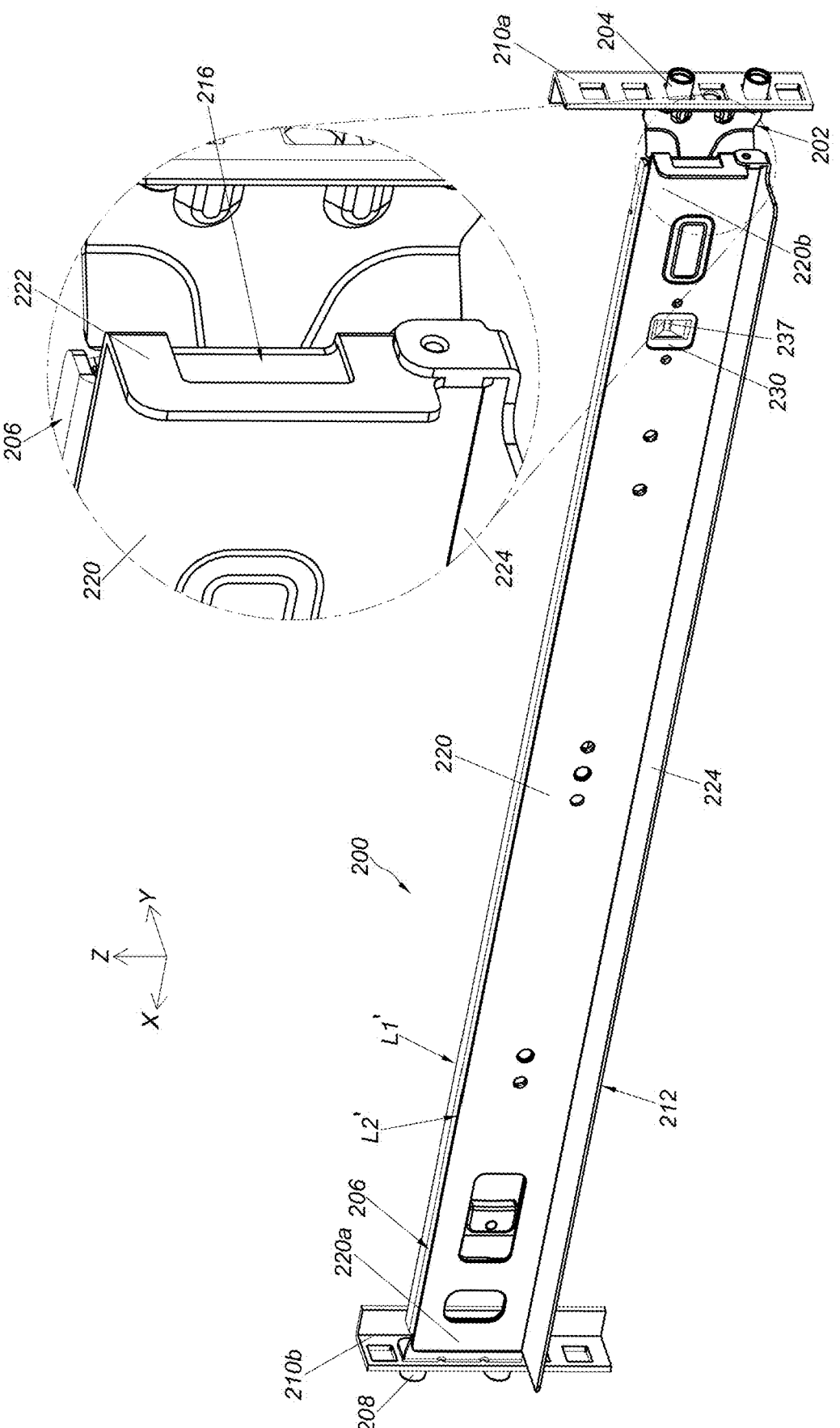
FIG. 11 is a diagram showing the bracket assembly being mounted to the rack according to a second embodiment of the present invention.
Figure 12:
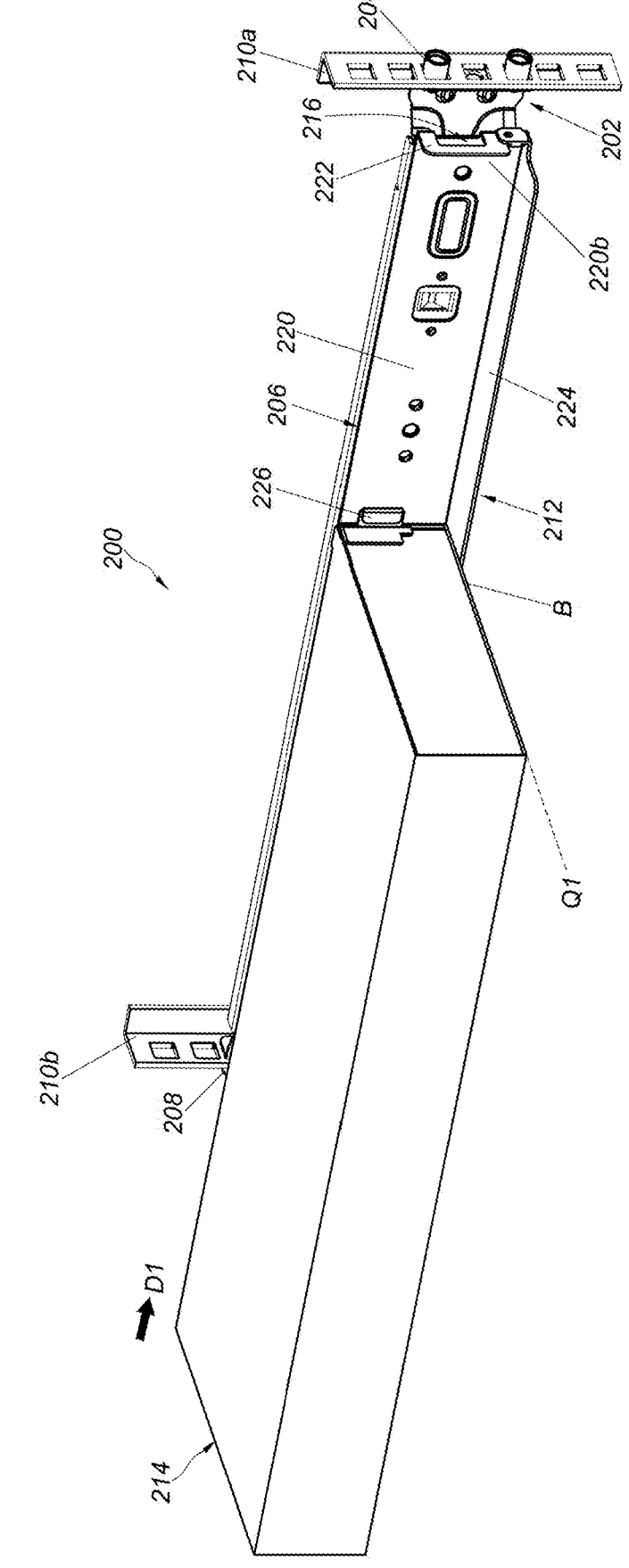
FIG. 12 is a diagram showing the bracket assembly being mounted to the rack and configured to carry a carried object located at a first predetermined position according to the second embodiment of the present invention.
Figure 13:
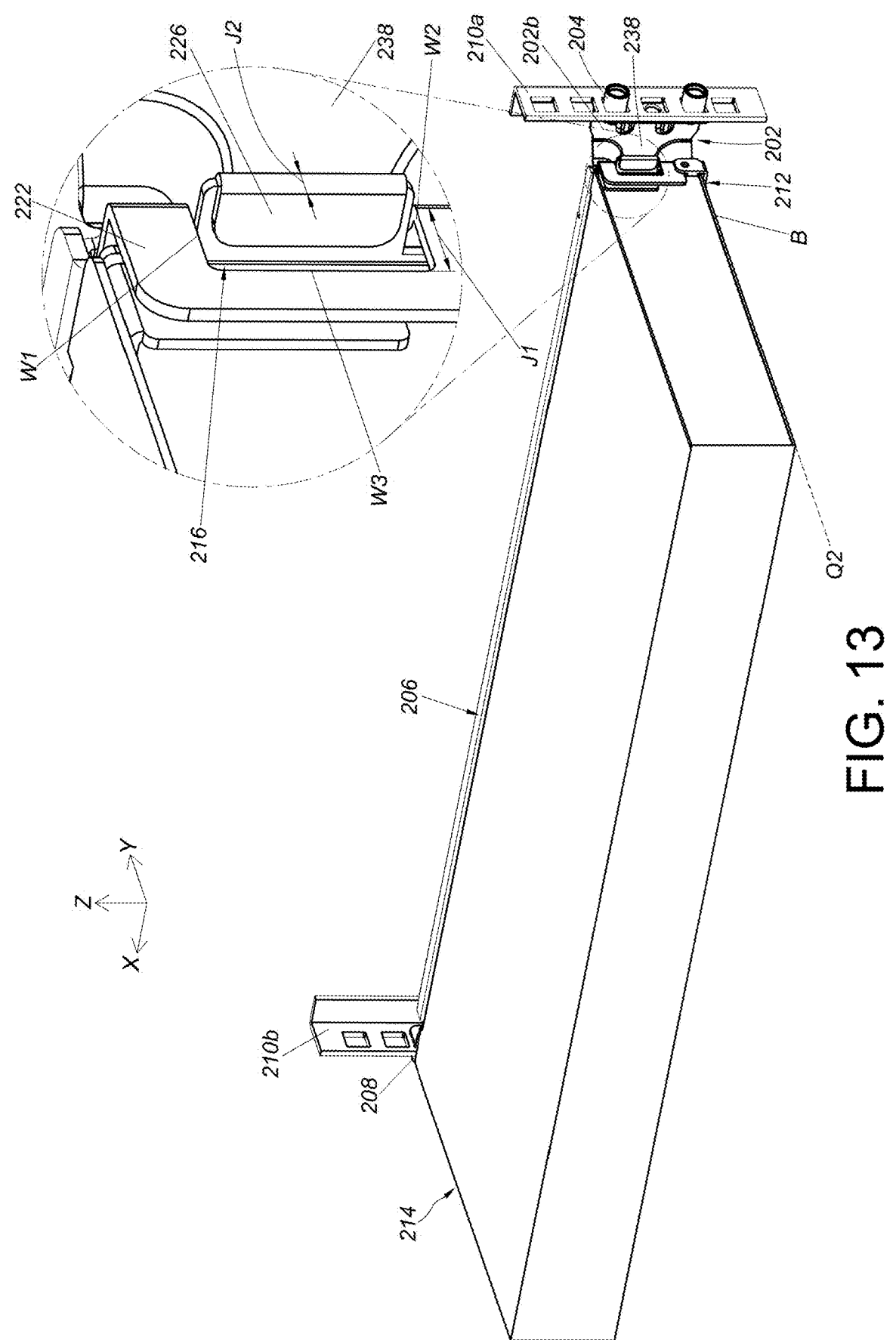
FIG. 13 is a diagram showing the bracket assembly being mounted to the rack and configured to carry the carried object located at a second predetermined position from a first viewing angle according to the second embodiment of the present invention.

FIG. 11 to FIG. 13 show a bracket assembly 200 configured to be mounted to a rack according to a second embodiment of the present invention. Specifically, a first mounting member 204 of a first bracket 202 and a second mounting member 208 of a second bracket 206 are configured to be mounted to a first post 210*a* and a second post 210*b* of a rack respectively. A first side L1' of the second bracket 206 faces toward the first bracket 202.

Different from the bracket assembly 20 of the first embodiment, a supporting member 212 (or a supporting rail) arranged on a second side L2' of the second bracket 206 of the bracket assembly 200 of the second embodiment is arranged with a mounting feature 216 configured to mount a carried object 214 (such as an electronic device or a chassis as shown in FIG. 12 and FIG. 13). The supporting member 212 is configured to support the carried object 214.

Furthermore, the mounting feature 216 is configured to mount the carried object 214 when the carried object 214 is retracted from a first predetermined position Q1 (as shown in FIG. 12) along a predetermined direction (such as the first direction D1) to a second predetermined position Q2 inside the rack (as shown in FIG. 13).

Preferably, the supporting member 212 comprises a longitudinal part 220. The longitudinal part 220 has a first end 220*a* and a second end 220*b* opposite to each other, such as a front end and a rear end, but the present invention is not limited thereto. A bending part 222 is arranged at the second end 220*b* of the longitudinal part 220, and the bending part 222 has the mounting feature 216. In the present embodiment, the bending part 222 is substantially perpendicularly connected to the second end 220*b* of the longitudinal part 220, but the present invention is not limited thereto.

Preferably, the supporting member 212 further comprises a supporting part 224, and the supporting part 224 and the longitudinal part 220 form a substantially L-shaped structure. The longitudinal part 220 is connected (such as fixedly connected) to the second side L2' of the second bracket 206, and the supporting part 224 is configured to support a bottom part B of the carried object 214.

Preferably, the mounting feature 216 is formed with an opening defined by a plurality of predetermined walls. In the present embodiment, the opening is defined by a first predetermined wall W1, a second predetermined wall W2, and a third predetermined wall W3. The carried object 214 comprises a protrusion part 226 (or a pin or the like) that can be inserted into the opening (as shown in FIG. 13). Furthermore, when the carried object 214 is retracted into the rack to be located at the second predetermined position Q2, the protrusion part 226 of the carried object 214 is configured to be inserted into the opening to be limited by the predetermined walls. Accordingly, the carried object 214 can be limited from being moved along a height direction (such as the Z-axis direction) or a transverse direction (such as the Y-axis direction) due to an unexpected force, such that safety and reliability of the carried object 214 being retracted into the rack can be improved. In addition, a first transverse width J1 of the opening is greater than a second transverse width J2 of the protrusion part 226 (as shown in FIG. 13), such that different carried objects 214 with different transverse tolerances can fit into the opening.

Preferably, the mounting feature 216 is located adjacent to the first mounting member 204 of the first bracket 202.

Figure 14:
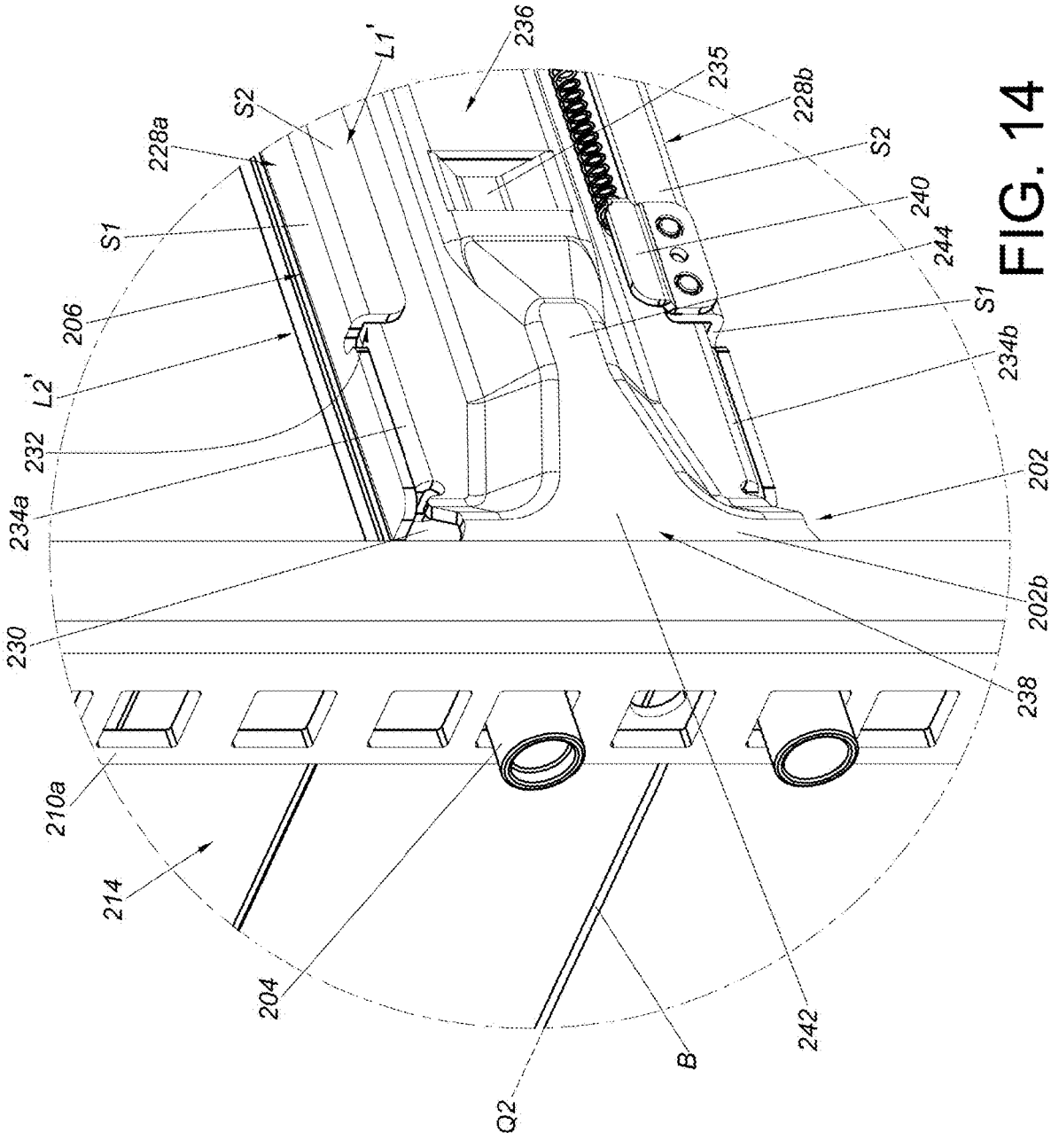
FIG. 14 is a diagram showing the bracket assembly being mounted to the rack and configured to carry the carried object located at the second predetermined position from a second viewing angle according to the second embodiment of the present invention.

As shown in FIG. 13 and FIG. 14, the carried object 214 is retracted into the rack to be located at the second predetermined position Q2. A predetermined passage 232 is defined by a first wall 228*a*, a second wall 228*b* and a longitudinal wall 230 of the second bracket 206. The first end of the first bracket 202 is configured to be inserted into the predetermined passage 232 of the second bracket 206 through a passage opening of the predetermined passage 232 (such configuration is identical to that of the first embodiment, no further illustration is provided for simplification). In addition, the first mounting member 204 of the first bracket 202 is located outside the predetermined passage 232. On the other hand, the first bracket 202 comprises a first wall 234*a*, a second wall 234*b*, and a longitudinal wall 236 connected between the first wall 234*a* and the second wall 234*b* of the first bracket 202.

Furthermore, the first wall 228*a* and the second wall 228*b* of the second bracket 206 face each other, and each of the first wall 228*a* and the second wall 228*b* of the second bracket 206 has a first section S1 and a second section S2 bent relative to the first section S1 (such as substantially perpendicularly bent relative to the first section S1, but the present invention is not limited thereto). The first wall 228*a* and the second wall 228*b* of the second bracket 206 are configured to respectively hold the first wall 234*a* and the second wall 234*b* of the first bracket 202. On the other hand, the first bracket 202 comprises a reinforcement structure 238. For example, the longitudinal wall 236 of the first bracket 202 comprises the reinforcement structure 238 adjacent to the second end 202*b* of the first bracket 202 and the mounting feature 216. Accordingly, the whole structural strength or support strength of the bracket assembly 200 can be improved, and the first bracket 202 and the second bracket 206 can be prevented from being moved transversely relative to each other. Therefore, the protrusion part 226 of the carried object 214 can be accurately inserted into the mounting feature 216 (such as the opening).

Preferably, the first bracket 202 is arranged with a first protruded feature 235 (as shown in FIG. 14), and the second bracket 206 is arranged with a second protruded feature 237 (as shown in FIG. 11). The first protruded feature 235 and the second protruded feature 237 can be bumps or protrusions. In the present embodiment, the longitudinal wall 236 of the first bracket 202 is arranged with the first protruded feature 235, and the longitudinal wall 230 of the second bracket 206 is arranged with the second protruded feature 237. Furthermore, the first protruded feature 235 of the longitudinal wall 236 of the first bracket 202 is configured to face toward and abut against the longitudinal wall 230 of the second bracket 206, and the second protruding feature 237 of the longitudinal wall 230 of the second bracket 206 is configured to face toward and abut against the longitudinal wall 236 of the first bracket 202. Accordingly, structural strength or support strength between the longitudinal wall 236 of the first bracket 202 and the longitudinal wall 230 of the second bracket 206 can be improved, and the first bracket 202 and the second bracket 206 can be prevented from being moved transversely relative to each other. Therefore, the protrusion part 226 of the carried object 214 can be accurately inserted into the mounting feature 216 (such as the opening).

Preferably, the second wall 228*b* of the second bracket 206 is further arranged with an extension member 240 (as shown in FIG. 14) extended from the second wall 228*b* and corresponding to the longitudinal wall 236 of the first bracket 202 in order to limit transverse movement of the first bracket 202 caused by an unexpected force.

Preferably, the reinforcement structure 238 is bulged relative to the longitudinal wall 236 of the first bracket 202 in a direction away from the carried object 214 in order to improve structural strength (as shown in FIG. 14).

Preferably, the reinforcement structure 238 comprises an enlarged part 242 and a narrowed part 244 longitudinally extended from the enlarged part 242. In contrast to the narrowed part 244, the enlarged part 242 is closer to the first mounting member 204, so as to improve strength of the first mounting member 204 being mounted to the first post 210*a* (as shown in FIG. 14).

Preferably, the reinforcement structure 238 has a substantially T-shaped structure (as shown in FIG. 14).

Therefore, the bracket assembly (20, 200) according to the embodiments of the present invention has the following technical features:

1. The supporting member 212 arranged on the second side L2' of the second bracket 206 is configured to support the carried object 214. The supporting member 212 is arranged with the mounting feature 216 configured to mount the carried object 214. The mounting feature 216 is configured to mount the carried object 214 when the carried object 214 is retracted from the first predetermined position Q1 (as shown in FIG. 12) to the second predetermined position Q2 inside the rack (as shown in FIG. 13). For example, the protrusion part 226 of the carried object 214 is configured to be inserted into the mounting feature 216 (such as the opening) to be limited by the predetermined walls of the mounting feature 216. Accordingly, the carried object 214 can be limited from being moved along the height direction (such as the Z-axis direction) or the transverse direction (such as the Y-axis direction) due to an unexpected force, such that safety and reliability of the carried object 214 being retracted into the rack can be improved.

2. The first wall 228*a* and the second wall 228*b* of the second bracket 206 face each other, and each of the first wall 228*a* and the second wall 228*b* of the second bracket 206 has the first section S1 and the second section S2 bent relative to the first section S1. The first wall 228*a* and the second wall 228*b* of the second bracket 206 are configured to respectively hold the first wall 234*a* and the second wall 234*b* of the first bracket 202. On the other hand, the longitudinal wall 236 of the first bracket 202 comprises the reinforcement structure 238 adjacent to the second end 202*b* of the first bracket 202 and the mounting feature 216. Accordingly, the whole structural strength or support strength of the bracket assembly 200 can be improved, and the first bracket 202 and the second bracket 206 can be prevented from being moved transversely relative to each other. Therefore, the protrusion part 226 of the carried object 214 can be accurately inserted into the mounting feature 216 (such as the opening).

3. The reinforcement structure 238 is bulged relative to the longitudinal wall 236 of the first bracket 202 in a direction away from the carried object 214, in order to work as a rib. Preferably, the reinforcement structure 238 comprises the enlarged part 242 and the narrowed part 244 longitudinally extended from the enlarged part 242. In contrast to the narrowed part 244, the enlarged part 242 is closer to the first mounting member 204, so as to improve the strength of the first mounting member 204 being mounted to the first post 210*a*.

4. The row of the first tooth parts 54*a* of the toothed bar 26 can work as a one-way toothed bar. The working member, such as the first working member 28, is a backstop pawl. When the tooth section T of the first working member 28 is engaged (or meshed) with the first tooth part 54*a* of the toothed bar 26, the first bracket 22 is only movable relative to the second bracket 24 along the first direction D1, and the second bracket 24 is only movable relative to the first bracket 22 along the second direction D2 opposite to the first direction D1, such that the distance defined between the first mounting member 34 and the second mounting member 44 can be adjusted to the second length K2 from the first length K1. Therefore, the bracket assembly 20 can be applied to racks with different longitudinal depths.

5. When the first working member 28 is engaged (or meshed) with the toothed bar 26, the first bracket 22 is not movable relative to the second bracket 24 along the second direction D2, and the second bracket 24 is not movable relative to the first bracket 22 along the first direction D1. Accordingly, when the bracket assembly 20 is mounted to the rack, the first mounting member 34 can be prevented from being detached from the first mounting holes H1 of the first post 92*a*, and the second mounting member 44 can be prevented from being detached from the second mounting holes H2 of the second post 92*b*, so as to improve safety of the bracket assembly 20 being mounted to the rack. And it is convenient for a single user to mount the bracket assembly 20 to the rack alone. Moreover, the user can operate the operating member 32 to disengage the first working member 28 from the toothed bar 26. In other words, the first working member 28 can be driven to move to be no longer meshed with the toothed bar 26, such that the first bracket 22 and the second bracket 24 are freely movable relative to each other along the first direction D1 and the second direction D2. Therefore, the length of the bracket assembly 20 can be shortened (such as shortened to the first length K1 from the second length K2) so as to detach the bracket assembly 20 from the rack.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket assembly, comprising:

a first bracket arranged with a first mounting member;

a second bracket longitudinally movable relative to the first bracket, the second bracket being arranged with a second mounting member; and a supporting member arranged on the second bracket and configured to support a carried object;

wherein the supporting member is arranged with a mounting feature configured to mount the carried object;

wherein the first bracket comprises a reinforcement structure adjacent to the mounting feature;

wherein the supporting member comprises a longitudinal part having a first end and a second end opposite to each other, the second end of the longitudinal part is arranged with a bending part, and the bending part has the mounting feature;

wherein the supporting member further comprises a supporting part, the supporting part and the longitudinal part form a substantially L-shaped structure, and the supporting part is configured to support a bottom part of the carried object;

wherein the mounting feature is located adjacent to the first mounting member of the first bracket.

2. The bracket assembly of claim 1, wherein the mounting feature is formed with an opening defined by a plurality of predetermined walls, and the carried object comprises a protrusion part configured to be inserted into the opening.

3. The bracket assembly of claim 2, wherein a width of the opening is greater than a width of the protrusion part.

4. The bracket assembly of claim 1, wherein the second bracket comprises a first wall, a second wall and a longitudinal wall connected between the first wall and the second wall of the second bracket, and a predetermined passage is defined by the first wall, the second wall and the longitudinal wall of the second bracket; wherein the first bracket has a first end and a second end opposite to each other, and the first end of the first bracket is configured to be inserted into the predetermined passage of the second bracket through a passage opening of the predetermined passage.

5. The bracket assembly of claim 4, wherein the first bracket comprises a first wall, a second wall and a longitudinal wall connected between the first wall and the second wall of the first bracket; wherein each of the first wall and the second wall of the second bracket has a first section and a second section bent relative to the first section, and the first wall and the second wall of the second bracket are configured to hold the first wall and the second wall of the first bracket respectively.

6. The bracket assembly of claim 5, wherein one of the first wall and the second wall of the second bracket is arranged with an extension member, and the extension member is configured to limit transverse movement of the first bracket.

7. The bracket assembly of claim 5, wherein the longitudinal wall of the first bracket comprises the reinforcement structure adjacent to the second end of the first bracket.

8. The bracket assembly of claim 7, wherein the reinforcement structure is bulged relative to the longitudinal wall of the first bracket.

9. The bracket assembly of claim 7, wherein the reinforcement structure comprises an enlarged part and a narrowed part longitudinally extended from the enlarged part.

10. The bracket assembly of claim 1, further comprising a toothed bar, a working member and an operating member; wherein the toothed bar is arranged on the first bracket, the working member is arranged on the second bracket and configured to be engaged with the toothed bar, and the operating member is movably mounted on one of the first bracket and the second bracket; wherein when the working member is engaged with the toothed bar, the first bracket is only movable relative to the second bracket along a first direction, and the second bracket is only movable relative to the first bracket along a second direction, such that a distance defined between the first mounting member and the second mounting member is adjustable from a first length to a second length; wherein the first direction is opposite to the second direction, and the second length is greater than the first length; wherein the operating member is configured to be operated to move from a first operating position to a second operating position in order to disengage the working member from the toothed bar, such that the first bracket is movable relative to the second bracket along the second direction and the second bracket is movable relative to the first bracket along the first direction.

11. The bracket assembly of claim 10, wherein the toothed bar is a one-way toothed bar, and the working member is a backstop pawl.

12. The bracket assembly of claim 10, further comprising an auxiliary member movably mounted to the second bracket, wherein the working member is pivotally connected to the auxiliary member on the second bracket; wherein one of the auxiliary member and the second bracket is formed with a longitudinal hole, and the other one of the auxiliary member and the second bracket is arranged with a connecting member passing through a portion of the longitudinal hole.

13. A bracket assembly applicable to a rack having a first post and a second post, the bracket assembly comprising:
   a first bracket arranged with a first mounting member;
   a second bracket longitudinally movable relative to the first bracket, the second bracket being arranged with a second mounting member, wherein the first mounting member and the second mounting member are configured to be mounted to the first post and the second post respectively; and
   a supporting member arranged on the second bracket and configured to support a carried object;
   wherein the supporting member is arranged with a mounting feature configured to allow a portion of the carried object to insert therein when the carried object is retracted relative to the rack from a first predetermined position to a second predetermined position;
   wherein the supporting member comprises a longitudinal part and a bending part, the longitudinal part has a first end and a second end opposite to each other, the second end of the longitudinal part is arranged with the bending part, and the bending part has the mounting feature;
   wherein the mounting feature is formed with an opening defined by a plurality of predetermined walls, and the carried object comprises a protrusion part configured to be inserted into the opening;
   wherein the mounting feature is located adjacent to the first mounting member of the first bracket; wherein the second bracket comprises a first wall, a second wall and a longitudinal wall connected between the first wall and the second wall of the second bracket, and a predetermined passage is defined by the first wall, the second wall and the longitudinal wall of the second bracket; wherein the first bracket has a first end and a second end opposite to each other, and the first end of the first bracket is configured to be inserted into the predetermined passage of the second bracket through a passage opening of the predetermined passage; wherein the first bracket comprises a first wall, a second wall and a longitudinal wall connected between the first wall and the second wall of the first bracket; wherein each of the first wall and the second wall of the second bracket has a first section and a second section bent relative to the first section, and the first wall and the second wall of the second bracket are configured to hold the first wall and the second wall of the first bracket respectively; wherein the longitudinal wall of the first bracket comprises a reinforcement structure adjacent to the second end of the first bracket and the mounting feature; wherein the reinforcement structure is bulged relative to the longitudinal wall of the first bracket.

14. The bracket assembly of claim 13, further comprising a toothed bar and a working member; wherein the toothed bar is arranged on the first bracket, and the working member is arranged on the second bracket and configured to be engaged with the toothed bar; wherein when the working member is engaged with the toothed bar, the first bracket is only movable relative to the second bracket along a first direction, and the second bracket is only movable relative to the first bracket along a second direction, such that a distance defined between the first mounting member and the second mounting member is adjustable from a first length to a second length; wherein the first direction is opposite to the second direction, and the second length is greater than the first length; wherein when the distance is adjusted to the second length, the first mounting member of the first bracket is configured to be mounted to the first post, and the second mounting member of the second bracket is configured to be mounted to the second post.

15. The bracket assembly of claim 14, further comprising an operating member movably mounted on the second bracket; wherein the operating member is configured to be operated to move from a first operating position to a second operating position in order to disengage the working member from the toothed bar, such that the first bracket is movable relative to the second bracket along the second direction and the second bracket is movable relative to the first bracket along the first direction.

16. A bracket assembly applicable to a rack having a first post and a second post, the bracket assembly comprising:

a first bracket arranged with a first mounting member;

a second bracket longitudinally movable relative to the first bracket, the second bracket being arranged with a second mounting member, wherein the first mounting member and the second mounting member are configured to be mounted to the first post and the second post respectively; and a supporting member arranged on the second bracket and configured to support a carried object;

wherein the supporting member is arranged with a mounting feature configured to allow a portion of the carried object to insert therein when the carried object is retracted relative to the rack from a first predetermined position to a second predetermined position;

wherein the bracket assembly further comprises a toothed bar and a working member; wherein the toothed bar is arranged on the first bracket, and the working member is arranged on the second bracket and configured to be engaged with the toothed bar; wherein when the working member is engaged with the toothed bar, the first bracket is only movable relative to the second bracket along a first direction, and the second bracket is only movable relative to the first bracket along a second direction, such that a distance defined between the first mounting member and the second mounting member is adjustable from a first length to a second length; wherein the first direction is opposite to the second direction, and the second length is greater than the first length; wherein when the distance is adjusted to the second length, the first mounting member of the first bracket is configured to be mounted to the first post, and the second mounting member of the second bracket is configured to be mounted to the second post.

* * * * *